(12) United States Patent
Beech et al.

(10) Patent No.: US 6,963,621 B1
(45) Date of Patent: Nov. 8, 2005

(54) METHOD AND APPARATUS FOR REDUCING DISTORTION OF DIGITAL DATA

(75) Inventors: Brian Herbert Beech, Southampton (GB); David Edwards, Southampton (GB)

(73) Assignee: Tandberg Television ASA, Lysaker (NO)

( * ) Notice: Subject to any disclaimer, the term of this patent is extended or adjusted under 35 U.S.C. 154(b) by 0 days.

(21) Appl. No.: 09/807,857

(22) PCT Filed: Oct. 22, 1999

(86) PCT No.: PCT/GB99/03425

§ 371 (c)(1),
(2), (4) Date: Apr. 19, 2001

(87) PCT Pub. No.: WO00/25495

PCT Pub. Date: May 4, 2000

(30) Foreign Application Priority Data

Oct. 23, 1998 (GB) .................................... 9823190

(51) Int. Cl.[7] .......................... H04K 1/02; H04L 25/03; H04L 25/49

(52) U.S. Cl. .................................................. 375/296

(58) Field of Search ........................ 375/296; 330/149; 398/193

(56) References Cited

U.S. PATENT DOCUMENTS

| 4,992,754 | A | | 2/1991 | Loboda et al. |
| 5,107,520 | A | | 4/1992 | Karam et al. |
| 5,113,414 | A | * | 5/1992 | Karam et al. ............... 375/296 |
| 6,288,814 | B1 | * | 9/2001 | Blauvelt ..................... 398/193 |

FOREIGN PATENT DOCUMENTS

| JP | 090162794 | 6/1997 |
| WO | 9532561 | 11/1995 |

OTHER PUBLICATIONS

Wolcott T.J. et al: "Uplink-Noise Limited Satellite Channels", Proceedings of the Military Communications Conference (Milcom), IEEE, Nov. 6, 1995, p. 717-721 XP000580915, New York, USA ISBN: 0-7803-2490-0.

* cited by examiner

*Primary Examiner*—Stephen Chin
*Assistant Examiner*—Curtis Odom
(74) *Attorney, Agent, or Firm*—Timothy J. Keefer; Seyfarth Shaw LLP

(57) ABSTRACT

A method of pre-distorting a signal of a satellite transmission link so as to offset later transmission of the signal during transmission across the satellite transmission link has a link including route Nyquist band pass filters in up and down links. The signal is passed through a cascade of identical pre-distorting stages each of which generates an approximation of the required pre-distortion. Each successive stage receives the approximation from the preceding stage so that errors in successive approximations converge towards zero.

20 Claims, 13 Drawing Sheets

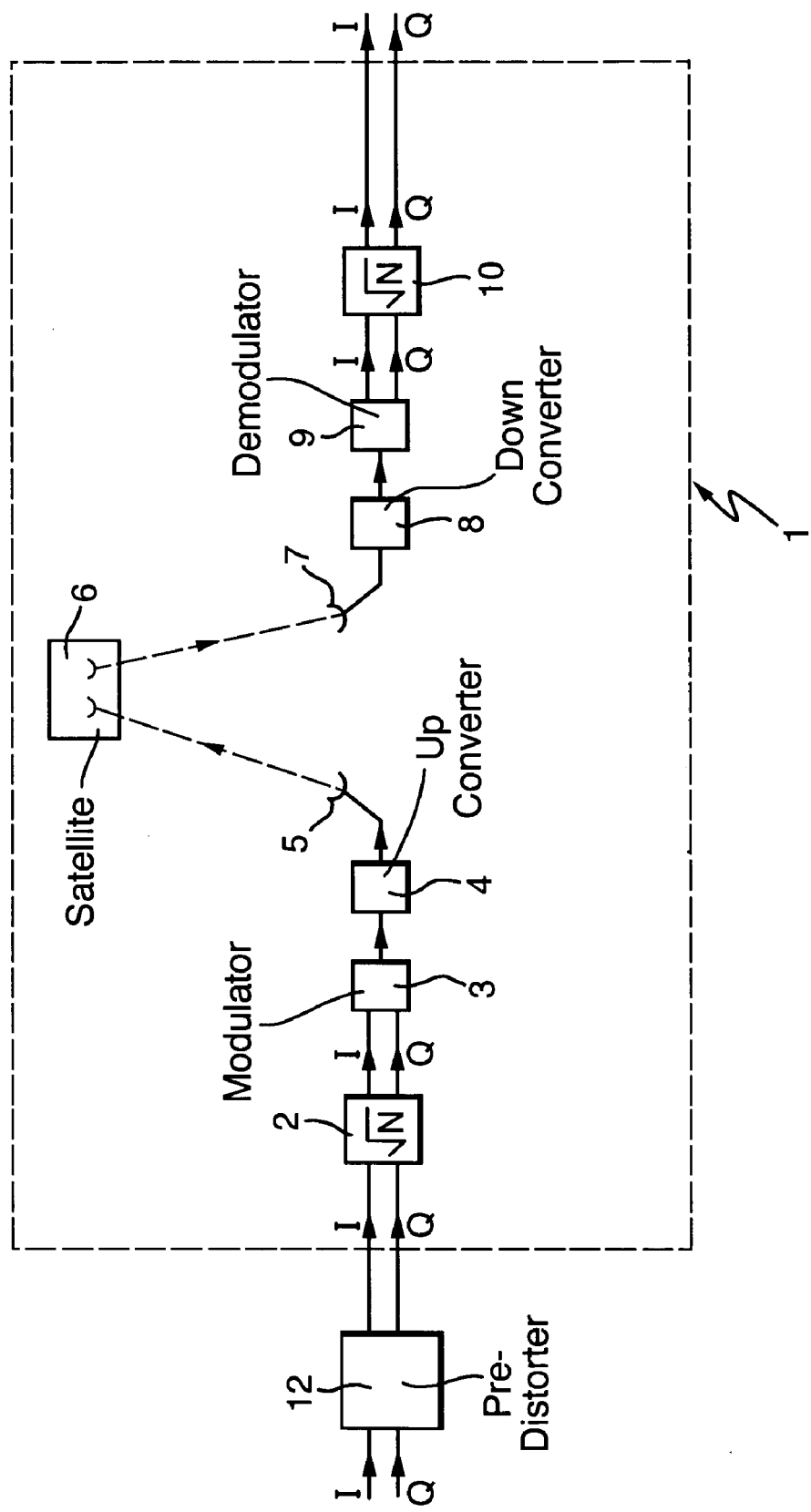

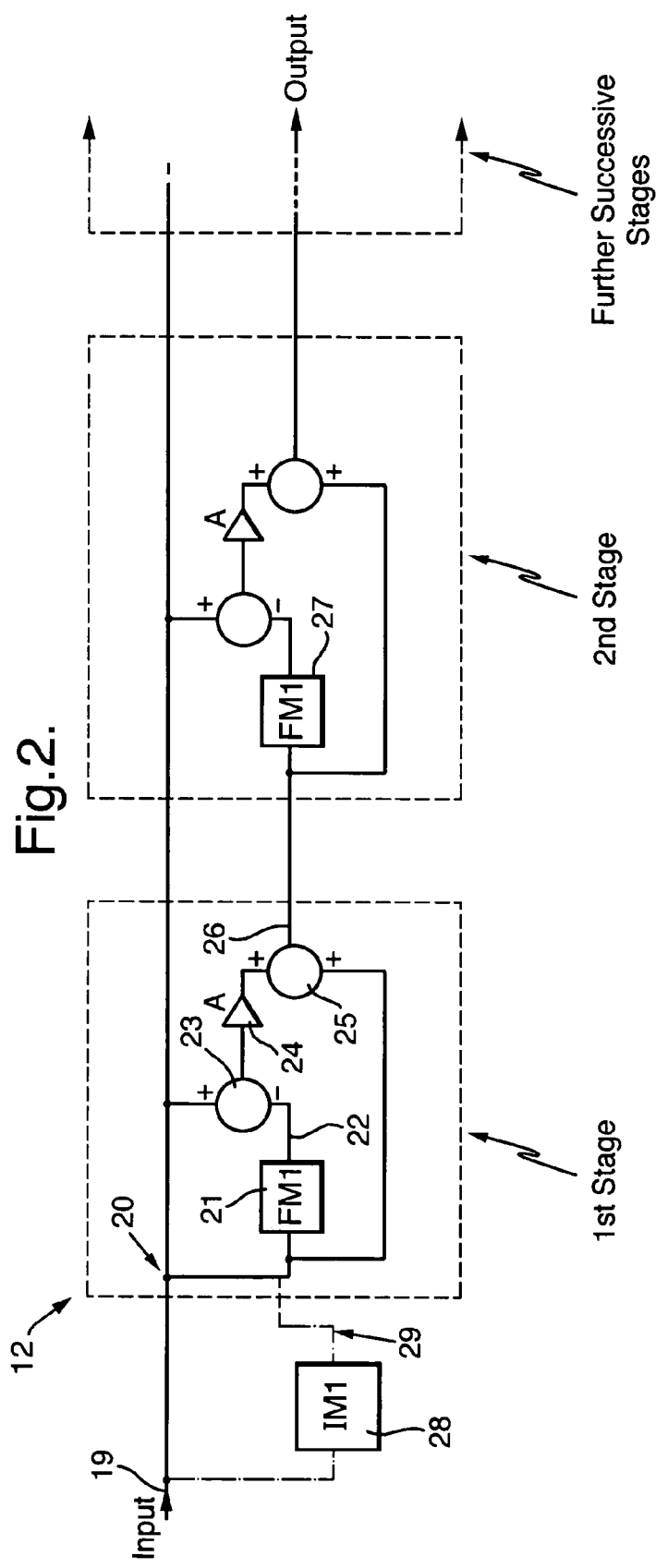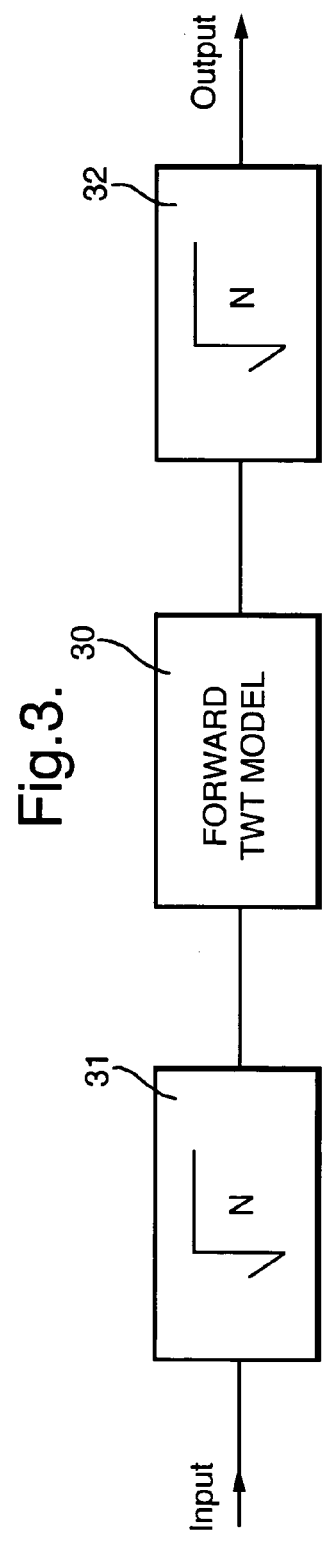

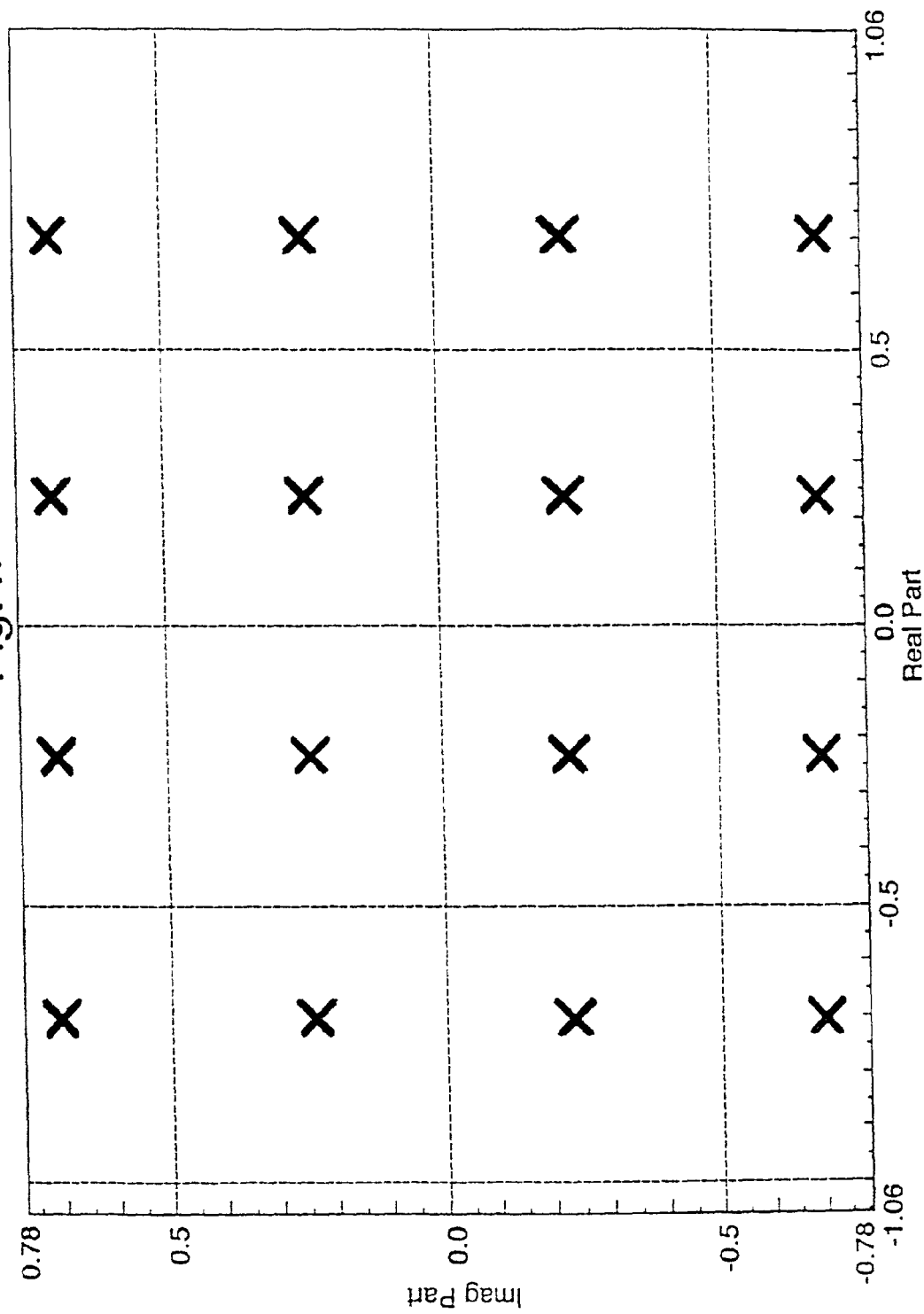

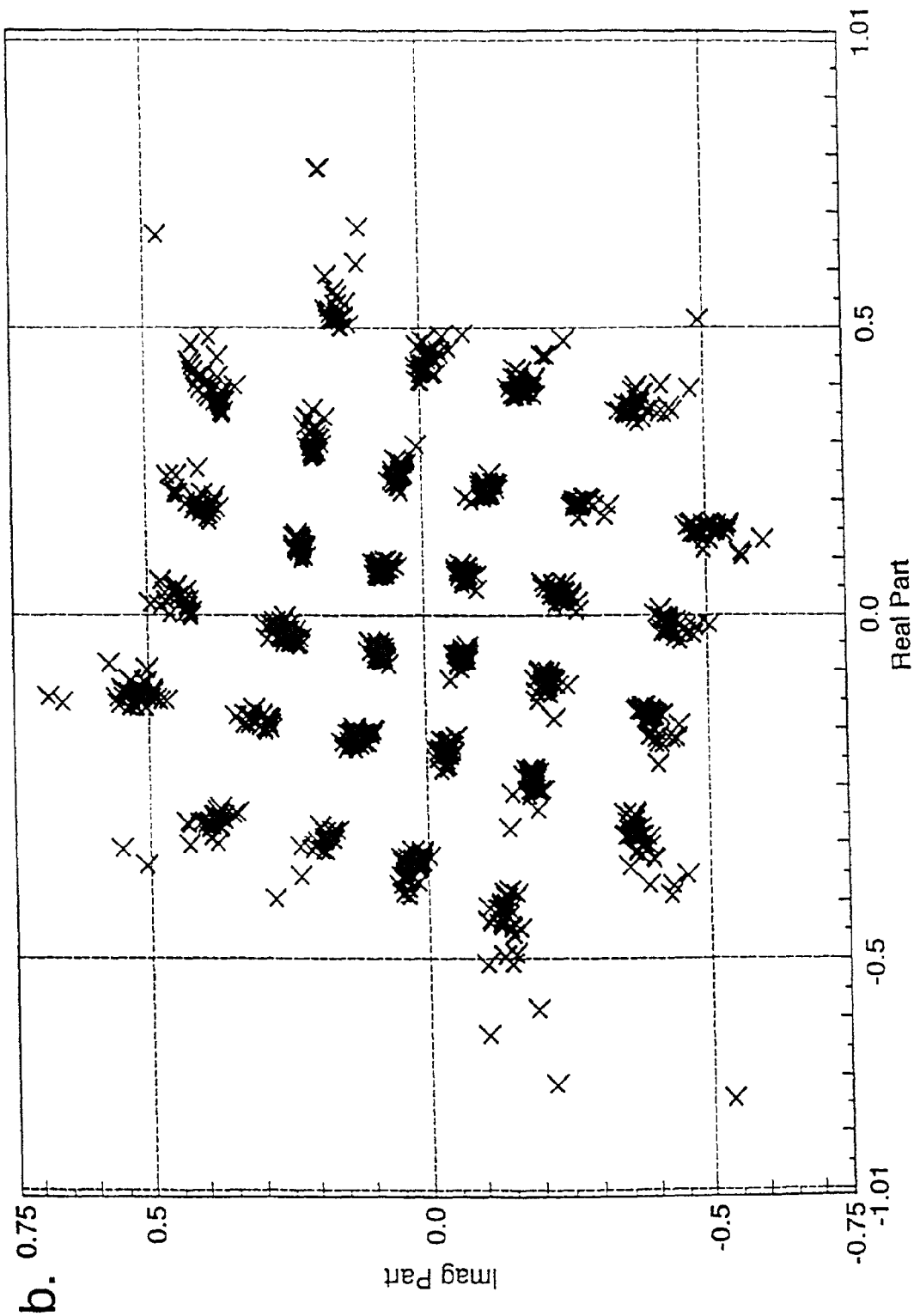

METHOD AND APPARATUS FOR REDUCING DISTORTION OF DIGITAL DATA

BACKGROUND OF THE INVENTION

1. Field of the Invention

This invention relates to the transmission of digital data, and in particular to method and apparatus for reduction of distortion incurred by representations of digital data during passage through transmission links.

2. Description of the Related Art

It is well known in the field of transmission of digital data, and particularly for transmission of data concerning digital broadcast material, for modulation techniques to use symbols, arranged as points in a particular constellation pattern to represent digital data. Typical techniques are those of phase Shift Keying (PSK) and Quadrature Amplitude Modulation (QAM). Two of the more common schemes of these techniques are those of Quadrature PSK (QPSK), e.g. digital satellite transmission for "direct to home" applications, and 8PSK for e.g. satellite news gathering applications. There is a recognized desire to utilize higher order modulation schemes, such as 16 PSK and 16 QAM. This will allow transmission at a higher bit rate, thus providing the opportunity to carry a greater number of channels within a pre-defined bandwidth of a particular transmission link.

Transmission of a modulated signal through transmission links such as terrestrial, satellite or cable links result in distortion of the signal. This distortion is due, in part at least, to the non-linear effects of passage of a signal through the transmission link. Distortion leads to a change in location of the constellation points of any given modulation scheme. An increase in the order of modulation results in a decrease in the distance between constellation points, and so leads to a higher probability of distortion leading to errors occurring during the demodulation of higher order modulation schemes.

Prior art methods used to reduce the effects of distortion by non-linear component(s) within transmission links include use of at least partially compensating pre-correction. One approach is that of feed-forward, where the non-linear output of an amplifier is sampled, and compared with the required signal prior to transmission, with the resultant error being subtracted from the amplifier output. This approach is only suitable for systems in which the pre-distorter and amplifier are co-located. Thus, where this technique is used for satellite transmission links the opportunity for introduction or modification of the pre-distorter to take account of changes in amplifier characteristics is severely limited.

Another technique is that of constellation pre-distortion, where the constellation points generated by the modulator are pre-distorted such that at the amplifier output the constellation points are located in their correct relative positions. This method is suitable only for transmission links that are memory-less. This precludes the use of this approach where pulse shaping takes place before non-linear amplification of the signal. Therefore, it is not suitable for those transmission links that include bandpass filtering of the signal.

Signal pre-distortion performed at the radio (RF), intermediate (IF) or base band frequencies is often carried out by application of an inverse function of the distortion to the signal as disclosed in WO-A-95132561 and U.S. Pat. No. 4,992,754. This type of pre-correction generates out of band components, which are then carried through to the amplifier input. Where the amplifier has an input filter, as is common for amplifiers used in satellite transmission links, then these components may be removed from the signal which becomes the input to the amplifier. Thus, the distortion imposed by the amplifier will not be accurately corrected as the amplifier input signal is not the entire transmitted signal. This means that this form of pre-correction is not effective for correction of amplifiers contained within satellite transponders where the bandwidth of the incoming signal is high in relation to the bandwidth of the transponder. Additionally, for digital transmission using higher order modulation schemes, this type of pre-correction requires very high clocking rates in order to generate the wide-band pre-distortion components.

SUMMARY OF THE INVENTION

It is an object of the present invention to overcome at least some of the problems associated with the prior art.

According to this invention there is provided a method of pre-distorting a signal of a satellite transmission link, said signal being modulated to carry symbols representative of digital data, so as to offset later distortion of the signal during transmission across the satellite transmission link, said link having root Nyquist bandpass filters in respective up and down links, the method including passing the signal through a cascade of identical pre-distorting states, each of which generates an approximation of the required pre-distortion, each successive stage receiving the approximation from the preceding stage so that errors in successive approximations converge toward zero with increase in the number of stages.

According to a second aspect of this invention there is provided a satellite transmission link including root Nyquist bandpass filters in respective up and down links and apparatus for pre-distortion of a signal, modulated to carry symbols representing digital data, so as to offset later distortion of the signal during transmission across said link, the apparatus comprising a cascade of identical pre-distorting stages, each said stage having means for generating an approximation of the required pre-distortion, and each successive stage being connected to receive the approximation from the preceding stage so that the errors in successive approximations converge toward zero with increase in the number of stages.

The method and apparatus of this invention allows input of a complex signal at a rate as low a one sample per symbol to the pre-distorter, and generating at its output a complex signal which may be at the same rate. This means that implementation of the hardware is practical for systems operating at higher symbol rates.

The method and apparatus of the invention are particularly suited to pre-distortion of a modulated signal which is subsequently transmitted through a satellite transmission link as it provides a ground based means of applying pre-distortion of the amplifier located on the satellite.

It is common for transmission links to include band pass filters between the means of modulating the signal and the amplifier. As is described above, such filters are known to remove at least substantial portions of any out of band components contained within a signal. Additionally, this invention provides accurate pre-distortion for transmission links having one of more band pass filter regardless of the location of such filter(s). Satellite transmission links commonly employ ground and satellite-based band pass filters.

The method and apparatus of this invention allows accurate pre-distortion for a transmission link carrying any constellation pattern and having any non-linear amplifier, irrespective of whether the link is memory less or not.

This allows pre-distortion to be applied to a signal for subsequent transmission through a transmission link having a band pass filter at each of the transmitter and receiver ends of the link. Additionally, by taking past and future symbols of the signal into account, not only can the static position of the constellation points to be pre-distorted accurately to take account of the effects of passage through the non-linearity of the link, but also the effects of inter-symbol interference (i.e. smearing) are substantially reduced.

The invention will now be described by way of example only and with reference to the following figures:

BRIEF DESCRIPTION OF THE DRAWINGS

FIG. 1 is a schematic diagram of a satellite transmission system incorporating a satellite transmission link.

FIG. 2 is a schematic diagram of a pre-distorter of the present invention.

FIG. 3 is a schematic diagram of the distorting function FM1 of FIG. 2.

FIG. 4 is a representation of an ideal 16 QAM constellation prior to transmission through a transmission link.

FIGS. 8a and 8b show the output of a receiver Nyquist filter for 32 QAM using a pre-distorter of the invention, and the corresponding constellation at the input to a transmitter Nyquist filter respectively.

DESCRIPTION OF THE PREFERRED EMBODIMENTS

Figure 5:
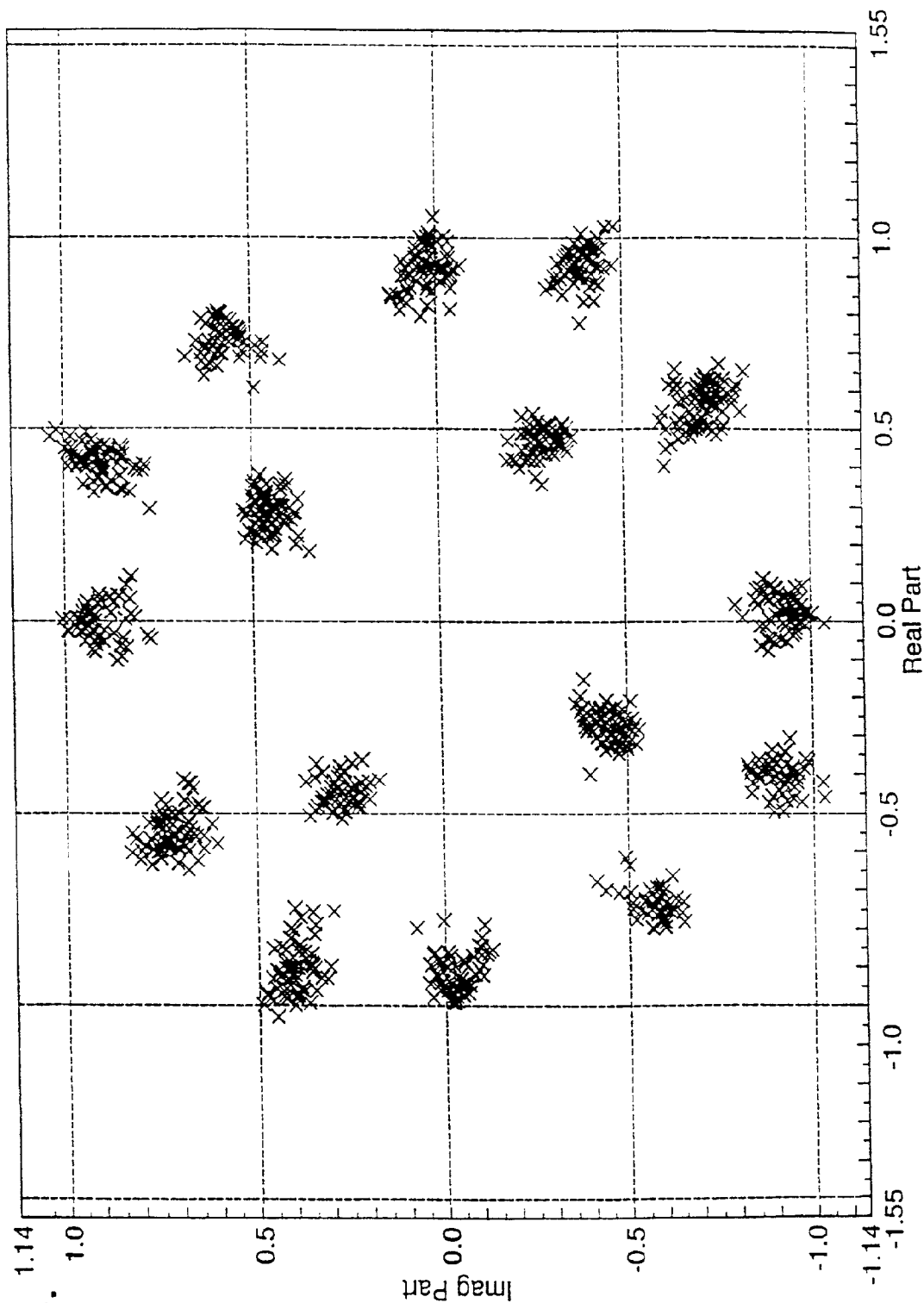
FIG. 5 is a representation of the output from a receiving Nyquist filter corresponding to the transmission link input of FIG. 4.
Figure 6A:
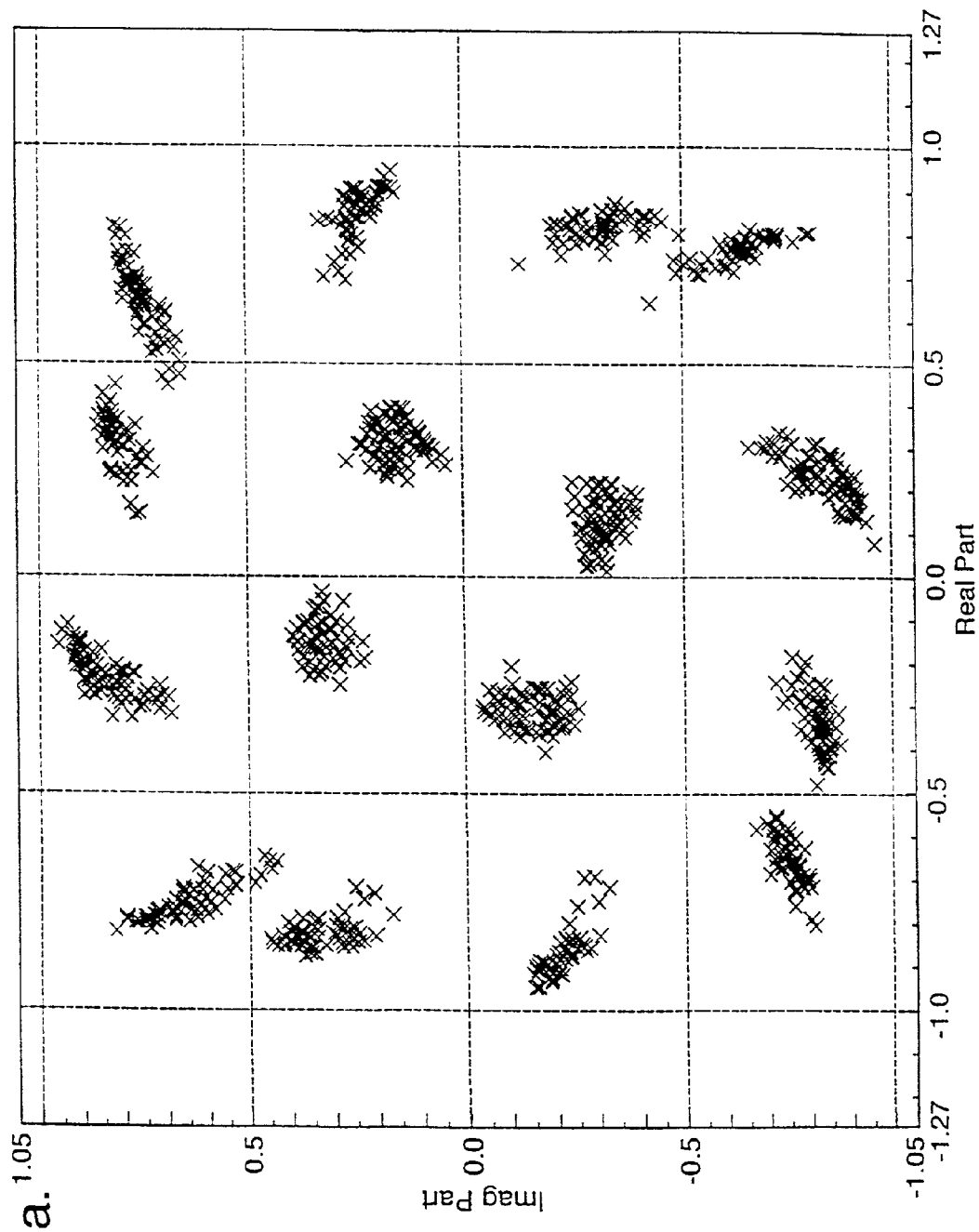
FIGS. 6a to 6d show computer simulations of outputs from a receiving Nyquist filter when different numbers of successive approximation stages are used.
Figure 6B:
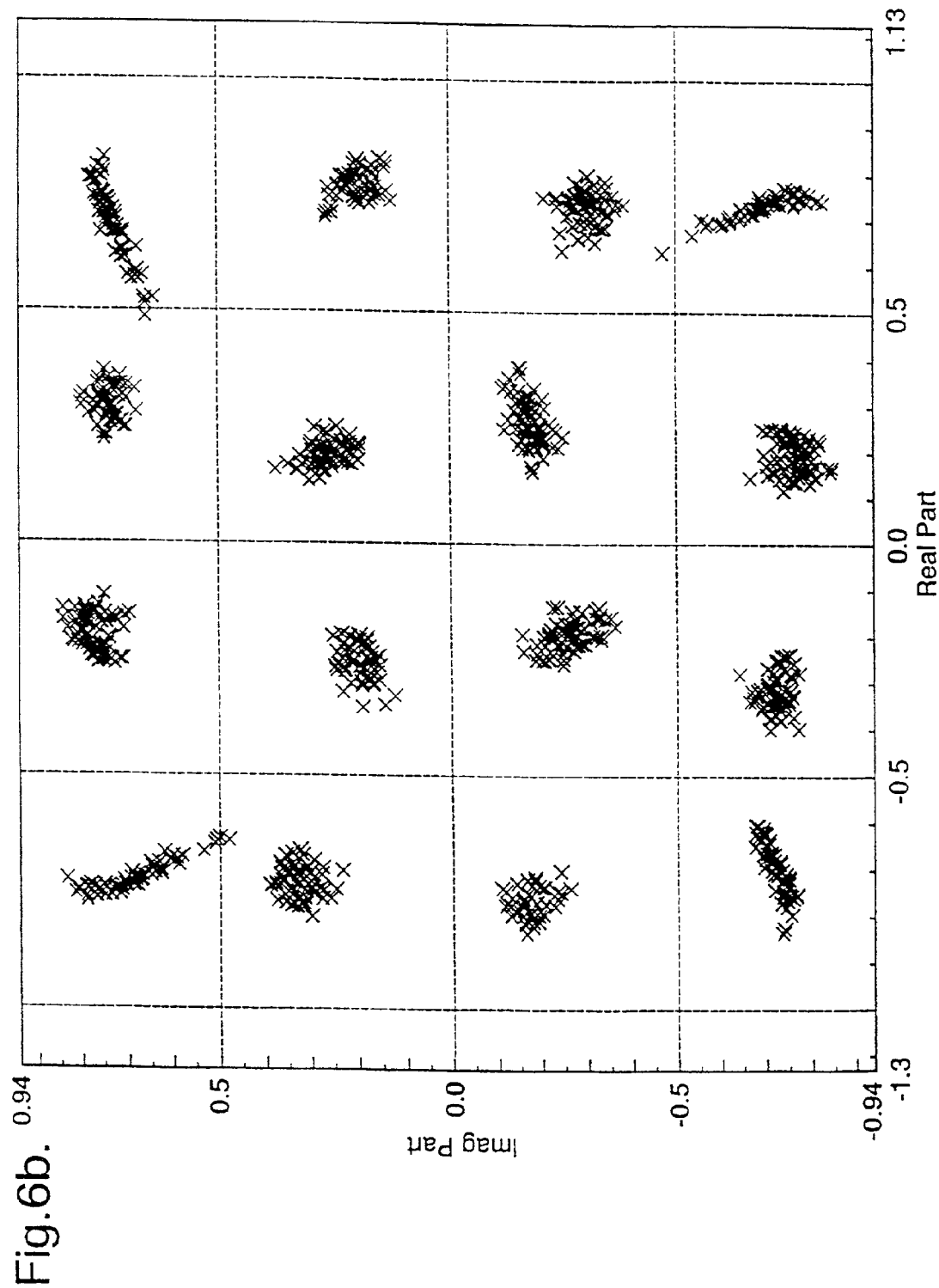
Figure 6C:
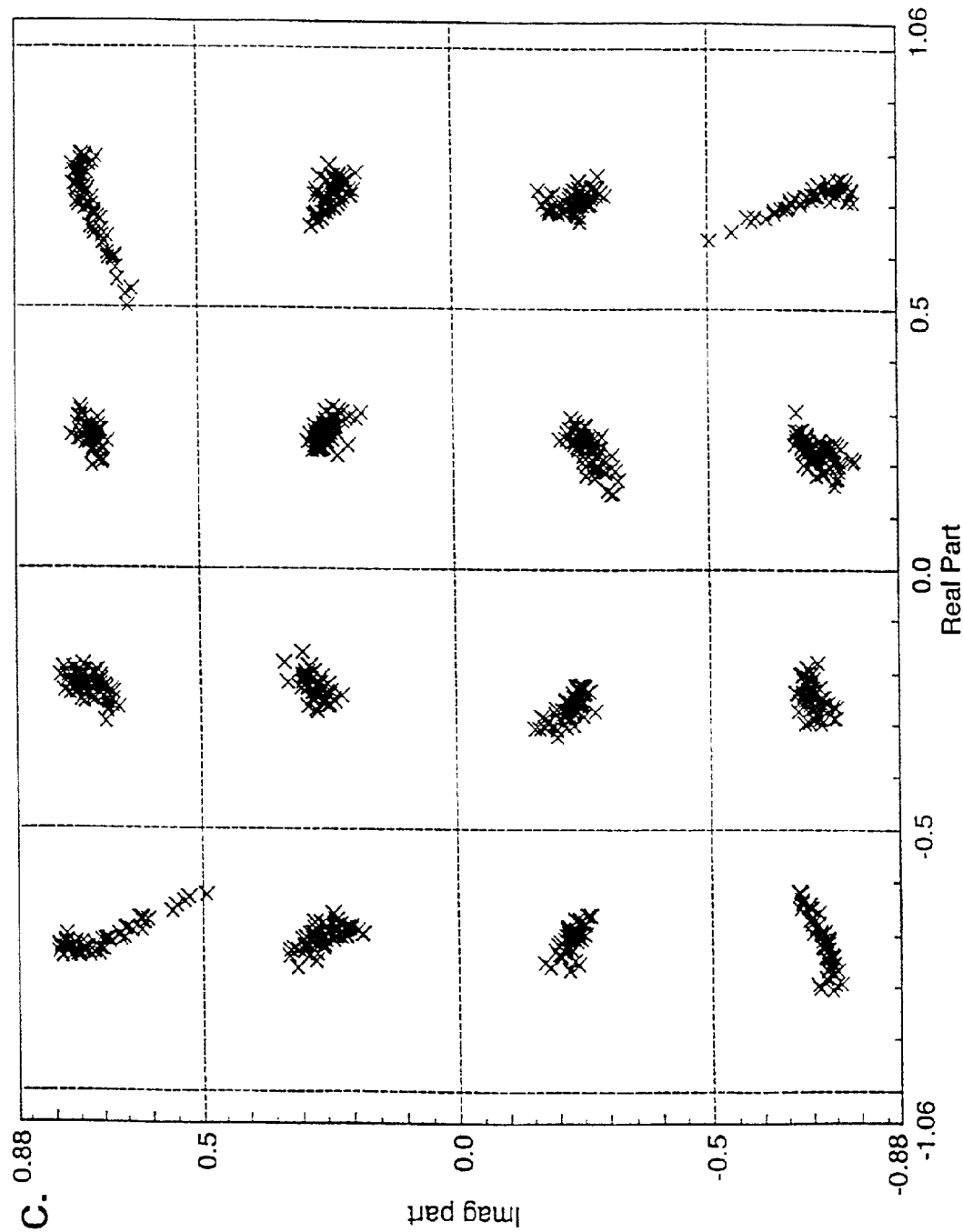
Figure 6D:
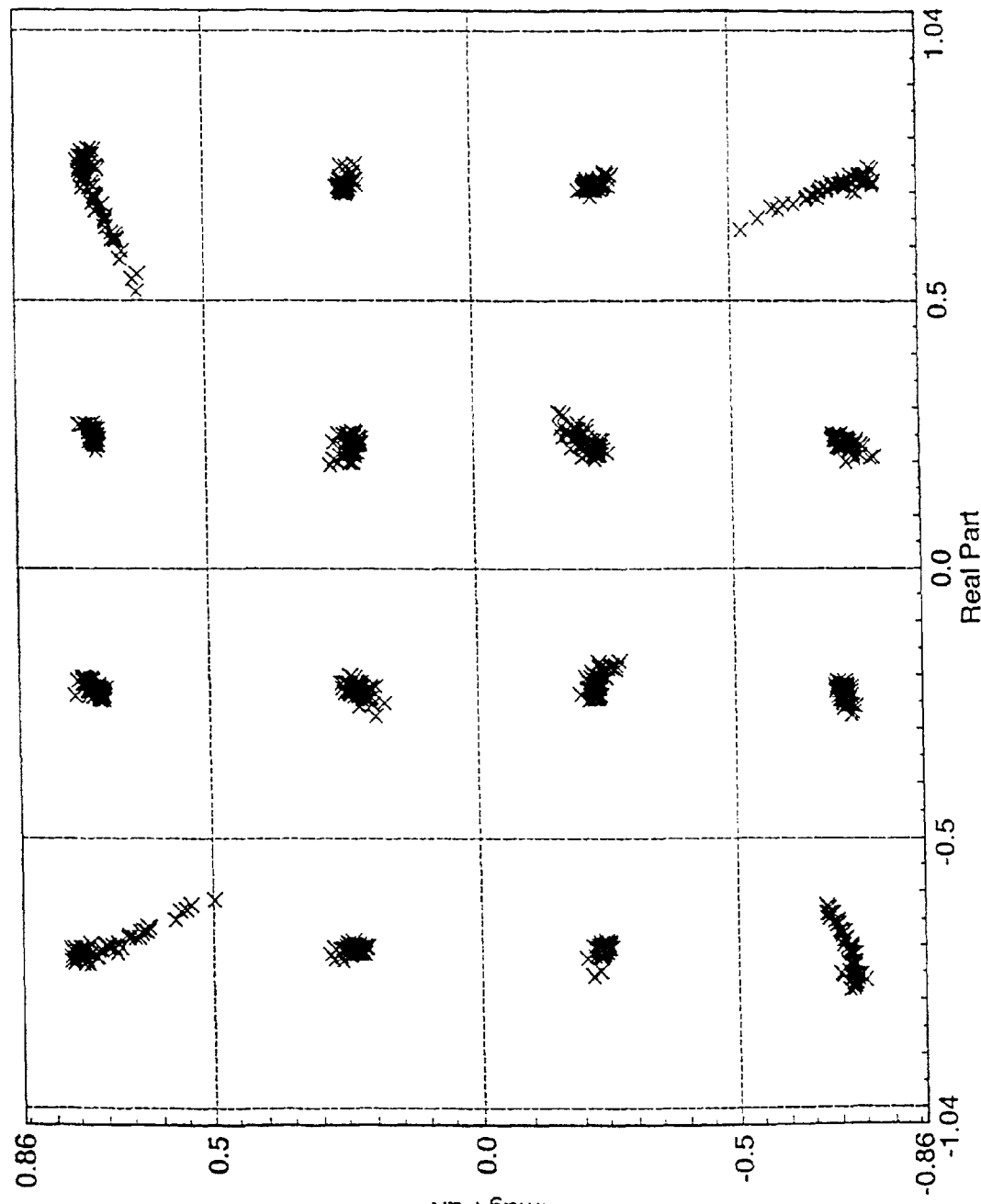

In FIG. 1 there is shown a satellite transmission link 1, having a root Nyquist band-pass filter 2, IQ modulator 3 and up-converter 4 prior to a transmitter 5. The transmitter provides an uplink to a satellite 6, which in turn provides a downlink to a number of receivers, one of which is shown as receiver 7. The receiver end of the satellite transmission link 1 can be seen as a reverse of the transmission end, with the receiver 7 connected successively through a down-converter 8, an IQ demodulator 9 and a root Nyquist band-pass filter 10.

During operation of the transmission link 1, an input base band frequency signal, being one which has been modulated by a particular technique and scheme such as 16 QAM and having I and Q complex components, is filtered by the root Nyquist band-pass filter 2. It is usual to use Nyquist filtering within transmission links in order to constrain the bandwidth of the transmitted signal. Conveniently Nyquist filtering of the signal is conducted by root Nyquist filters placed at each of the transmitter and receiver ends of the transmission link. Nyquist and root Nyquist filters impose a linear distortion upon the modulated signal.

Each of the I and Q components of the root Nyquist filtered signal are provided as inputs to the IQ modulator 3 such that the input to up-converter 4 is a modulated carrier which represents the digital data of the chosen modulation scheme. The up-converter changes the frequency of the input signal to a higher frequency than base band. The higher frequency signal is transmitted to satellite 6, where it is received by the satellite's transponder (not shown), amplified by a travelling wave tube amplifier (TWT) and retransmitted from the transponder to a plurality of receivers 7. The transponder is often constructed such as to ensure that the transponder input is passed through band-pass filters before and after being amplified by the TWT. Band-pass filters include the characteristics of not allowing out of band components to pass through the filter.

On receipt of the transponder output by receiver 7 the signal is processed by each of down-converter 8, IQ demodulator 9 and root Nyquist filter 10 to provide an output from the transmission link 1 in the form of a base band frequency signal having I and Q components. This output is then subsequently demodulated to obtain the digital data transmitted by the symbols within the modulation scheme.

In addition to the satellite transmission link 1, FIG. 1 also shows a pre-distorter 12 located prior to the transmission link 1. The pre-distorter is adapted to operate in accordance with the invention of this application, and arranged to apply pre-distortion to an incoming signal to compensate for the distortion subsequently applied to that signal during its passage through the satellite transmission link 1.

FIG. 2 is a block diagram of the pre-distorter 12 in greater detail. It is assumed that all signals (input to, output from and within the pre-distorter) are complex signals. However, it will be understood by those skilled in the art that in a practical implementation these signal could be in the form of either Cartesian or polar representation. The input signal 19 to the pre-distorter 12 is fed from junction 20 to a forward model of a distorting function 21 representative of the distortion of the satellite transmission link to supply symbols representative of digital data for time=t(1). The output 22 of this forward model is input along with the input signal 19 (which is arranged to be supply symbols representative of digital data for time=t(1) by use of unshown delay apparatus) at summing node 23. The output of summing node 23 is scaled by a value A by a multiplier 24. The output of multiplier 24 is combined with input signal 19 (also arranged to supply symbols representative of digital data for time=t(1) by use of unshown delay apparatus) to summing node 25 to provide an output 26 from the first stage of approximation. This output 26 is determined by equation (1) given below.

Output 26=(input 19)*A−(output 22)*A+(input 19)
Output 26=[(input 19)−(output 22)]*A+(input 19)   Equation 1

[(input 19)−(output 22)] is the error which exists between output 22 and input 19, and therefore Output 26=(input 19)−(error*A)   Equation 2

It will be understood that Output 26 concerns symbols representative of digital data for time=t(1).

Output 26 acts as the input forward model 27 of the identical second stage of successive approximations, and is the same as input 19 to the first stage, but modified by the error scaled by a factor A. It can be seen that the pre-distorter 12 generates an error for symbols representative of digital data for time=t(1) in relation to the output of forward model 21 of the first stage of the successive approximations but the correction to account for pre-distortion is applied in relation to the input to forward model 27 of the next stage. During passage of symbols representative of digital data for time=t(1) through the second stage of successive approximation, the first stage of successive approximation is supplied at junction 20 with symbols representative of digital data for time=t(1+n) where n represents the pipeline delay.

It can be shown that with a suitable choice of A the use of successive approximations such as given in the pre-distorter 12 of FIG. 2 then the output of the pre-distorted will converge towards zero error as more stages of successive approximation are added. In practice A is chosen to achieve the highest convergence rate for a given forward model distorting function. For a transmission link such as that of FIG. 1, then it has been found that six stages of successive approximation strikes a reasonable balance between convergence towards zero error and hardware implementations of the pre-distorter. Optionally, pre-distorter 12 may additionally include an initial approximator 28. This initial approximator is arranged to operate function IM1, which is a function arranged to provide an output which is approximately the inverse of forward model distorting function FM1 as implemented by forward model distorting functions 21, 27 and their equivalents in further successive stages. Where initial approximator 28 is included within a pre-distorter 12, then output 29 is provided as an input to distorting function 21 and instead of input 19 fed from junction 20. This is arranged to ensure (through use of appropriate delays to operate for symbols representative of digital data for time=t(1) as described above.

Thus equation (2) becomes

Output 26=(Output 29)−error*A    Equation 3

For pre-distortion of an amplifier such as a TWT, the initial approximator 28 may be a function which places the constellation points in the correct place for pre-distortion but which does not dynamically change their position from symbol to symbol. This is known as a static pre-distortion. Using a static pre-distortion for a rough approximation substantially reduces the number of successive approximation stages required. Typically one static correction stage plus three dynamic stages (implemented by passage through one successive approximation stage) is sufficient to attain the desired pre-distortion of a satellite transmission link such as that of FIG. 1.

The distorting function 21 for the transmission link 1 of FIG. 1 may be of the form shown in FIG. 3. This consists of a forward TWT model 30, with root Nyquist filters 31 and 32 placed before and after the model. It is the presence of the root Nyquist filters which enables the pre-distorter 12 to correct for the signal transitions from one constellation point to another. The practical implementation of the root Nyquist filters enables the summation of scaled sample values. The sample values include both past and future samples. This is the mechanism that enables correction for the effects of distortion upon symbols which rely upon past and future symbols for their later interpretation during demodulation, i.e. the dynamic distortion. When used in combination with successive approximation this allows for a substantial reduction in the effects of inter-symbol interference.

The method and apparatus of this invention can be adapted in the manner exemplified in this embodiment so as not to generate out of band components. Instead, the non-linear correction components are folded back into the bandwidth of the signal, and thus provide accurate pre-distortion for transmission links having one or more band pass filters.

If it is required that the pre-distorter shall correct additionally for the uplink High Power Amplifier (HPA), then a forward HPA model can also be included in in the forward model distorting function. Alternatively, a completely separate pre-distorter could be used.

As an example of the operation of a pre-distorter, some simulation results are given in FIGS. 4 to 9. In this example A=0.875=⅞. The use of simple fractions with a binary denominator reduces hardware complexity. A Nyquist link with 35% roll-off factors is included.

FIG. 4 shows an ideal 16QAM constellation to be transmitted with the corner points placed at TWT saturation and FIG. 5 shows the corresponding output from a typical TWT. The constellation points are displaced and additionally they are smudged due to the transition affects caused by the transmit Nyquist filter/TWT combination.

FIGS. 6a to 6d show the result corresponding to the outputs of successive pre-distorter stages. It can be seen, when comparing the results of FIG. 6a with those of FIG. 5 (no correction by means of a pre-distorter), that passage through just one stage of successive approximation leads to an improvement in the dynamic distortion imposed by a satellite link such as that of FIG. 1. The result can be improved by adding further pre-distorter successive approximation stages, as can be seen by comparison of the results of FIGS. 6b to 6d.

Use of greater numbers of successive approximation stages leads to all points, except for the four corner points, becoming nearer to being substantially ideal following passage through each additional successive approximation stage. The corner points, which are at TWT saturation, exhibit a comet tail effect. This is due to the fact that, at these points, the gain of the TWT is zero and perfect convergence is not possible. Nevertheless the link Bit Error Rate (BER) approaches that of the linear link.

Figure 7:
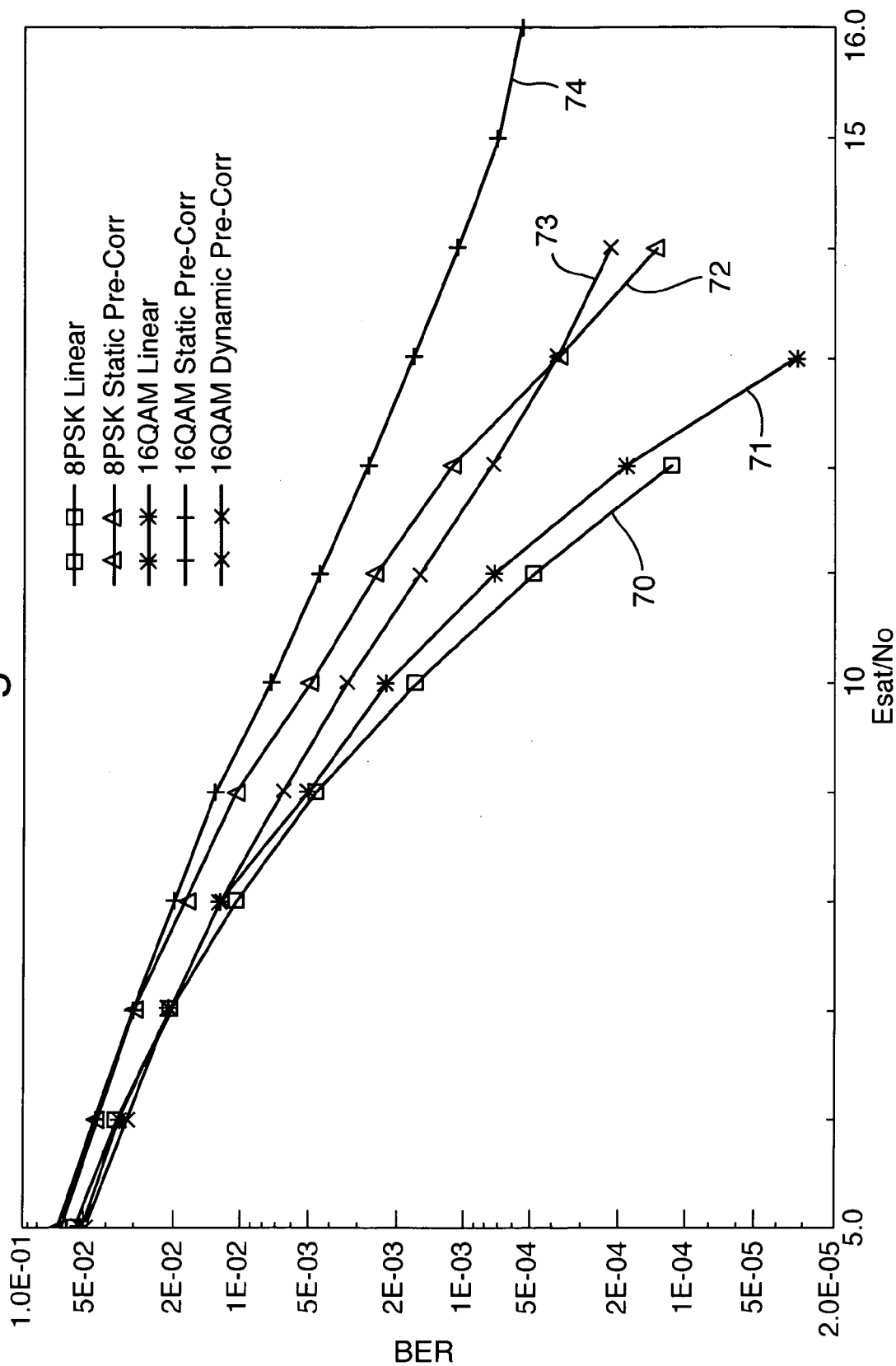
FIG. 7 is a graphical comparison of Bit Error Rates of differing pre-distortion circumstances.

FIG. 7 shows a comparison of a satellite transmission link BER for various uncoded modulations wherein static and dynamic pre-distortion should be noted.

Line 70 represents the BER for a signal modulated by 8PSK and transmitted through a transmission link having no non-linear distortion. Thus, this is also the ideal signal output BER of a transmission link following passage through a pre-distorter. Line 71 represents the same ideal for the different modulation scheme of 16QAM. Line 72 demonstrates the BER of a signal having been modulated by 8PSK and being pre-distorted by the pre-distorted by the prior art technique of static pre-distortion. Graph lines 73 and 74 represent the BERs of the 16QAM modulated signals having static and dynamic pre-distortion, and static only pre-distortion respectively. It should be noted that a 16QAM modulated signal subjected to both static and dynamic pre-distortion demonstrates better performance than a signal modulated by 8PSK and pre-distorted by the prior art techniques of static only pre-distortion. As explained earlier, higher order modulation schemes are inherently more susceptible to increased BER due to the decreasing distance between constellation points. FIG. 7 thus demonstrates the significant increase in performance associated with use of the pre-distortion method and apparatus of this application.

Figure 8A:
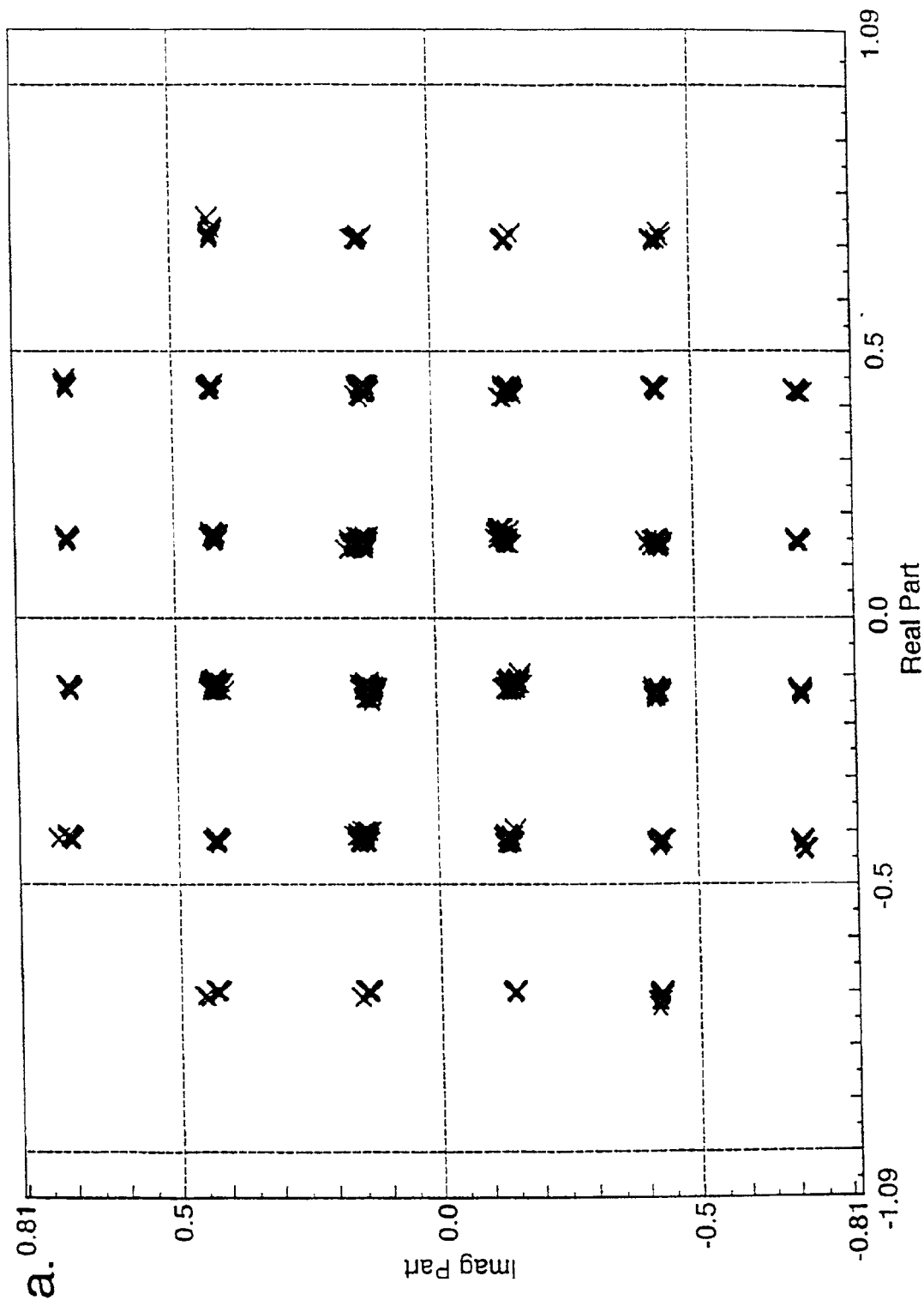
Figure 9:
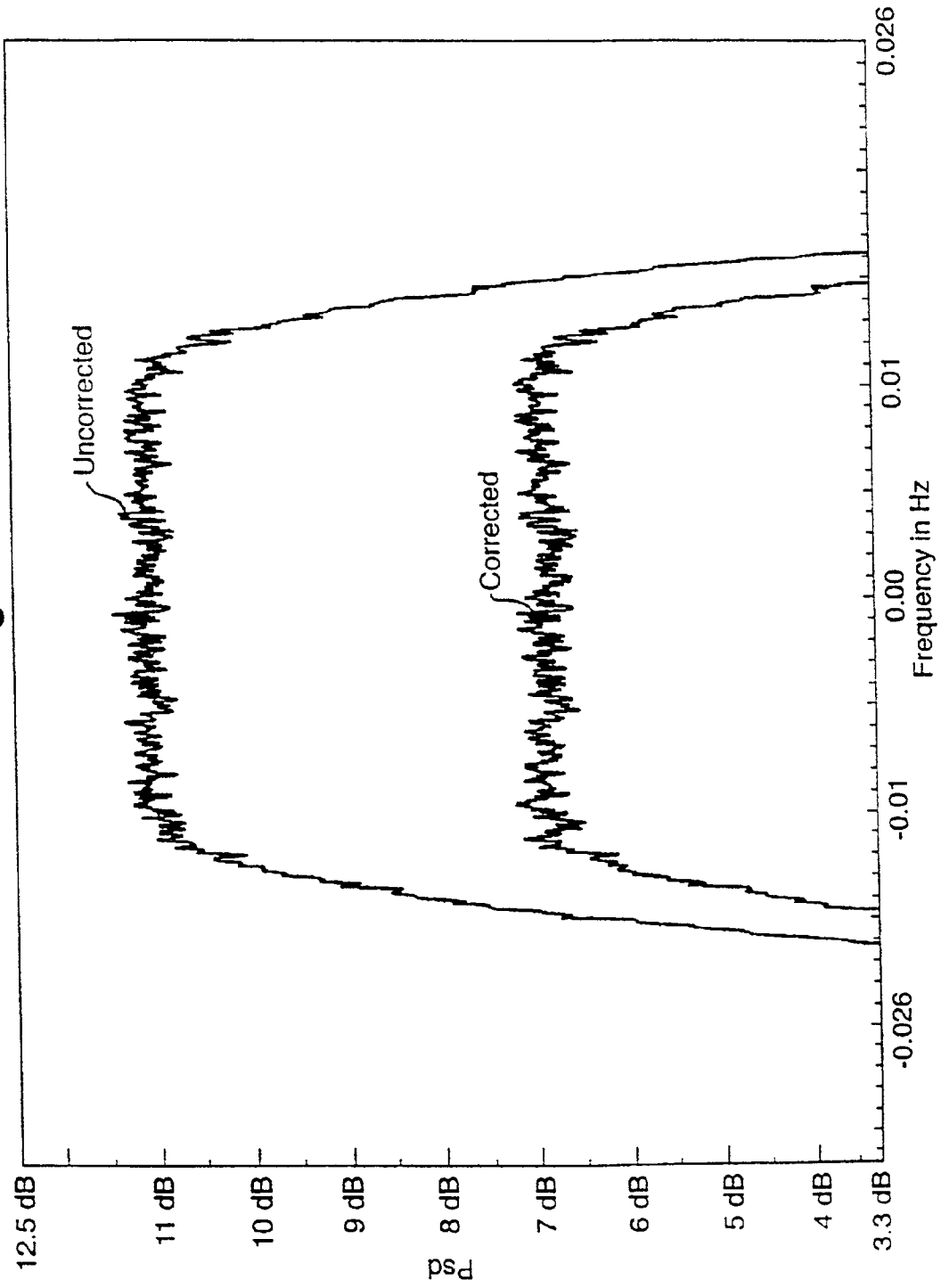
FIG. 9 shows a computer simulation of the output spectrum of the pre-distorter in comparing it with the spectrum without the use of pre-distortion.

32 QAM is particularly suited to pre-distortion in accordance with this invention because the corner points are missing and all the remaining points pre-correct well. FIG. 8a shows the output from a satellite transmission link TWT with pre-distortion using 6 stages of dynamic pre-distortion only. A=0.875 and 35% roll off factor. The corner points that are missing would be at the saturation point of the TWT if they were present. FIG. 8b shows the pre-distorter output, which is a 32QAM constellation to be transmitted through a satellite transmission link. FIG. 9 shows the output spectrum from the uplink for the case with and without pre-distortion. It is clear that in both cases the spectrum follows the shape of the transmit Nyquist filter and the only difference is that the pre-distorted signal is about 34 dB lower in power.

In the above description is has been assumed that the characteristics of the TWT are known and these parameters are programmed into the pre-distortion hardware.

Figure 10:
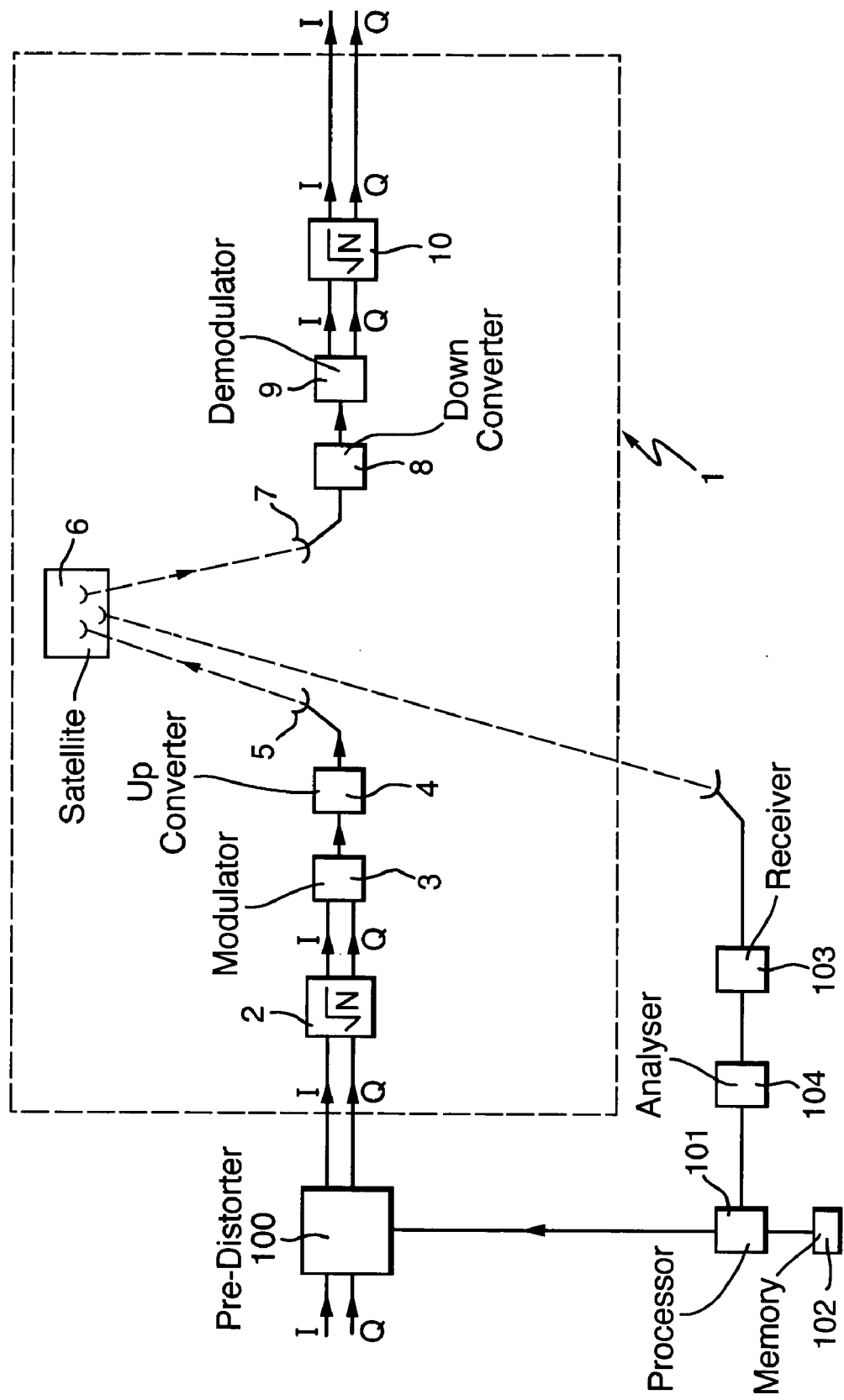
FIG. 10 is a schematic diagram of a feedback control loop.

FIG. 10 illustrates a block diagram of a feedback control loop, which includes a satellite of satellite transmission link 1, for modification of the pre-distortion parameters of the forward model distorting function FM1 of FIG. 3.

The pre-distorter 100 receives its control parameters from microprocessor 101. The required non-linear characteristics are generated by the microprocessor and are down-loaded into RAM in the pre-distorter. Two modes are possible. In the non-feedback mode, it is assumed that the parameters for a particular satellite are known and these are stored in memory 102. The accuracy of pre-distortion will be limited be the accuracy of these parameters.

In the feedback mode, the satellite output is received by receiver 103 and the constellation analyser 104 generates error signals, which correspond to the displacement of the constellation points. For 16QAM for example the constellation points fall on three circles, so a magnitude and phase error estimate may be made for each of the three circles. The error signals are processed by a software algorithm implemented in the microprocessor to generate updates of the control parameters passed to the pre-distorter.

It will be realised that the time delay of the return path to the satellite is approximately 0.25 seconds, and so the update time of the control parameters must be equal or longer than this delay. However, in practice the TWT parameters will only be slowly varying.

In the feedback mode described above, no training sequence is required. However, if the parameters of the satellite TWT are not known, then the constellation from the TWT may be so distorted that the tracking feedback loop cannot pull into lock.

One solution for this is to add a training sequence into the transmission. An alternative method is to provide a separate training signal. When the up-link is first operational into the satellite, a set up mode in the modulator generates a training signal, which may not be of the same modulation type as the intended transmission. The micro-processor runs an algorithm to calculate the required correction parameters based on the signal from receiver 103. Subsequent to this procedure, transmission of the intended transmission may start and the feedback mode accurately maintains the control parameters. In the case of intermittent loss of the received signal, the corrector continues to correct accurately because the most recent control parameters are stored in the pre-distorter RAM.

What is claimed is:

1. A method of pre-distorting a signal of a satellite transmission link, said signal being modulated to carry symbols representative of digital data, so as to offset later distortion of the signal during transmission across the satellite transmission link, said link having root Nyquist bandpass filters in respective up and down links, the method including passing the signal through a cascade of identical pre-distorting stages, each of which generates an approximation of the required pre-distortion, each successive stage receiving the approximation from the preceding stage in an iterative fashion so that errors in successive approximations converge toward zero with increase in the number of stages.

2. The method of claim 1, wherein the transmission link has a particular bandwidth and wherein the signal is passed through a cascade of pre-distorting stages, each of which generates an approximation of the required pre-distortion within the said bandwidth.

3. The method of claim 1, wherein said signal is applied to a forward model representative of the distortion of the satellite transmission link, an output of the forward model is added with said signal to provide an error signal, said error signal is amplified and further summed with said signal to provide an input to a next succeeding stage.

4. The method of claim 1, wherein said signal is passed through an initial approximator prior to passage through successive approximation stages.

5. The method of claim 4, wherein the initial approximator comprises a static pre-distortion approximation function.

6. The method of claim 1, wherein the signal is modulated in accordance with 16 QAM.

7. The method of claim 1, wherein the signal is modulated in accordance with 32 QAM.

8. The method of claim 1, wherein the signal is modulated in accordance with 16 PSK.

9. A satellite transmission link including root Nyquist bandpass filters in respective up and down links and apparatus for pre-distortion of a signal, modulated to carry symbols representing digital data, so as to offset later distortion of the signal during transmission across said links, the apparatus comprising a cascade of identical pre-distorting stages, each said stage having means to generate an approximation of the required pre-distortion, and each successive stage being connected to receive the approximation from the preceding stage so that the errors in successive approximations converge toward zero with increase in the number of stages.

10. A link according to claim 9, wherein the transmission link has a particular bandwidth, and wherein each pre-distorting stage is arranged to generate an approximation within the said bandwidth.

11. A link as claimed in claim 9, wherein each pre-distorting stage includes a forward model representative of the distortion of the satellite transmission link arranged to receive said signal, a summer to add an output of said forward model with said signal to provide an error signal, an amplifier to amplify said error signal, and an output of said amplifier being applied to a further summer to add an output of said amplifier with said signal, wherein an output of said further summer may be applied as input to a forward model of a next succeeding stage.

12. A link as claimed in claim 9, wherein an initial approximator is connected to provide input to a first of said pre-distorting stages.

13. A link as claimed in claim 12, wherein the initial approximator comprises a static pre-distortion approximation model.

14. A link as claimed in claim 9, wherein the signal is modulated in accordance with 16 QAM.

15. A link as claimed in claim 9, wherein the signal is modulated in accordance with 32 QAM.

16. A link as claimed in claim 9, wherein the signal is modulated in accordance with 16 PSK.

17. A link as claimed in claim 9, wherein six successive approximation stages are provided.

18. A link as claimed in claim 13, wherein one static pre-distortion and three successive approximation stages are provided.

19. A link as claimed in claim 9, wherein a feedback control loop is provided from the satellite transmission link to the cascade of pre-distorting stages.

20. A link as claimed in claim 19, wherein the feedback control loop includes a receiver to receive signals transmitted by a satellite, a constellation analyzer to generate error signals produced by the receiver, in which error signals are representative of a displacement of constellation points in the signal, the constellation analyzer to provide output to a processor to produce non-linear characteristics as an input to said apparatus.

* * * * *

UNITED STATES PATENT AND TRADEMARK OFFICE
CERTIFICATE OF CORRECTION

PATENT NO. : 6,963,621 B1
APPLICATION NO. : 09/807857
DATED : November 8, 2005
INVENTOR(S) : Beech et al.

It is certified that error appears in the above-identified patent and that said Letters Patent is hereby corrected as shown below:

In Column 7, Line 2, delete "34 dB" and insert -- 4 dB --, therefor.

Signed and Sealed this

Tenth Day of March, 2009

JOHN DOLL
*Acting Director of the United States Patent and Trademark Office*